United States Patent [19]

Su et al.

[11] Patent Number: 4,706,253
[45] Date of Patent: Nov. 10, 1987

[54] HIGH SPEED INGAASP LASERS BY GAIN ENHANCEMENT DOPING

[75] Inventors: Chin B. Su, Newton; Vincent A. Lanzisera, Northboro; Richard I. Freeman, Reading, all of Mass.

[73] Assignee: GTE Laboratories Incorporated, Waltham, Mass.

[21] Appl. No.: 734,131

[22] Filed: May 15, 1985

[51] Int. Cl.$^4$ .................................................. H01S 3/19
[52] U.S. Cl. ........................................ 372/44; 357/17; 372/26
[58] Field of Search ................ 372/44, 45, 26; 357/17

[56] References Cited

U.S. PATENT DOCUMENTS 4,132,960  1/1979  Streifer et al. .......................... 372/45
4,426,700  1/1984  Hirao et al. ............................. 372/46

OTHER PUBLICATIONS

Figueora et al., IEEE J. Quantum Elect., QE-18, 1718 (1982).
Tucker et al., Electron. Lett., 20L393 (1984).
Su et al., Appl. Phys. Lett., 45:1302 (1984).
Su et al., Appl. Phys. Lett., 46:344 (1985).
C. B. Su and R. Olshansky, Appl, Phys. Lett., 43:856 (1983).
Liau et al., Appl. Phys. Lett. 40:568 (1982).

Primary Examiner—James W. Davie
Attorney, Agent, or Firm—Ernest V. Linek

[57] ABSTRACT

A new method for increasing the modulation bandwidth of InGaAsP lasers is described herein. The method of the present invention is based on the gain enhancement doping of the lasers active layer. Lasers with highly doped active regions were demonstrated to have larger modulation bandwidths than lightly doped devices.

14 Claims, 5 Drawing Figures

HIGH SPEED INGAASP LASERS BY GAIN ENHANCEMENT DOPING

BACKGROUND OF THE INVENTION

The present invention is directed to high speed semiconductor lasers. More particularly, this invention is directed to a method for increasing the bandwidth in InGaAsp lasers, said method comprising doping the active layer of said lasers, p-type, e.g., with Zn, Cd, Be, Mg, and the like.

InGaAsp lasers are reliable light sources, especially suitable for high data rate optical communication systems. High data rates are generally limited by the devices intrinsic bandwidth performance. Previous techniques applied to increase laser modulation bandwidths are:

(a) use of short cavity lengths.
(b) Operation of the laser at high bias optical power in analog applications.

Both of these techniques are useful for increasing modulation bandwidths, but each has technical limitations. The shortest practical limit to the cavity length is about 50 μm which is due to the technical difficulties of cleaving and wire bonding to a short cavity device. Moreover, it is generally undesirable to bias the laser at high bias power because of increased system noise and reduced device reliability.

Previous experimental work has shown that direct amplitude modulation bandwidths of 4 to 5 GHz are possible in a number of AlGaAs laser structures, see Figueroa et al., *IEEE J. Quantum Elect.*, QE-18, 1718 (1982). More recently, X-band small signal modulation bandwidths of AlGaAs lasers of 11 GHz have been achieved by use of a short cavity window laser biased at 16 mw/facet of optical power, see Lau et al., Postdeadline Paper WJ1, Conf. Opt. Fiber Conn., (1984).

Small signal experiments of 1.3 μm wavelength Double channel planar-buried heterostructure (DCP-BH) lasers with a resonance frequency as high as 9.3 GHz have been reported, see Tucker et al., *Electron. Lett.*, 20: 393 (1984). However, the modulation amplitude of the DCP-BH laser exhibits a very strong roll-off at frequencies well below the resonance frequency.

It is known that short cavity vapor phase regrown—buried heterostructure (VPR-BH) lasers with a p-doping of $2\times10^{18}$ cm$^{-3}$ have a wide modulation bandwidth and a flat optical response. See, Su et al., *Appl. Phys. Lett.*, 45: 1302 (1984) and Su et al., *Appl. Phys. Lett.*, 46: 344 (1985). A flat optical response is obtained for the VPR-BH lasers grown on conductive substrates rather than on semi-insulating substrates. At a bias optical power of only 6.9 mW/facet, the bandwidth is 12.5 GHz. The limited bandwidth of the detector prevents measurement of the frequency response at higher bandwidths.

SUMMARY OF THE INVENTION

The present invention is directed to a new technique for increasing laser modulation bandwidth and to lasers modified thereby. More particularly, it has been discovered that if the active layer of high speed lasers, especially, 1.3 μm InGaAsp devices, are highly doped p-type, the modulation bandwidth increases significantly as the p-doping level increases.

Several devices with different doping levels have been fabricated and tested. Larger gain constants and wider modulation bandwidths have been demonstrated for the highly doped devices.

Modification of the active layer p-doping level thus provides yet another important parameter for optimization of diode bandwidth performance.

BRIEF DESCRIPTION OF THE DRAWINGS

FIG. 2 (inset) is the electrical circuit of the diode of FIG. 2;

DETAILED DESCRIPTION OF THE PREFERRED EMBODIMENTS

A typical 1.3 μm InGaAsp diode laser consists of: an n-type InP substrate, an n-type InP confinement layer, a low doped (n or p-type) active layer of nominal formula

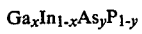

$$Ga_xIn_{1-x}As_yP_{1-y}$$

a p-type InP confinement layer, and a p-type InGaAsp cap layer.

This invention is based on the discovery that for InGaAsp lasers the gain constant is a strongly increasing function of the active layer p-type doping level. This discovery implies that a significant increase in laser modulation bandwidth is achievable for devices with a highly doped active region.

Figure 1A:
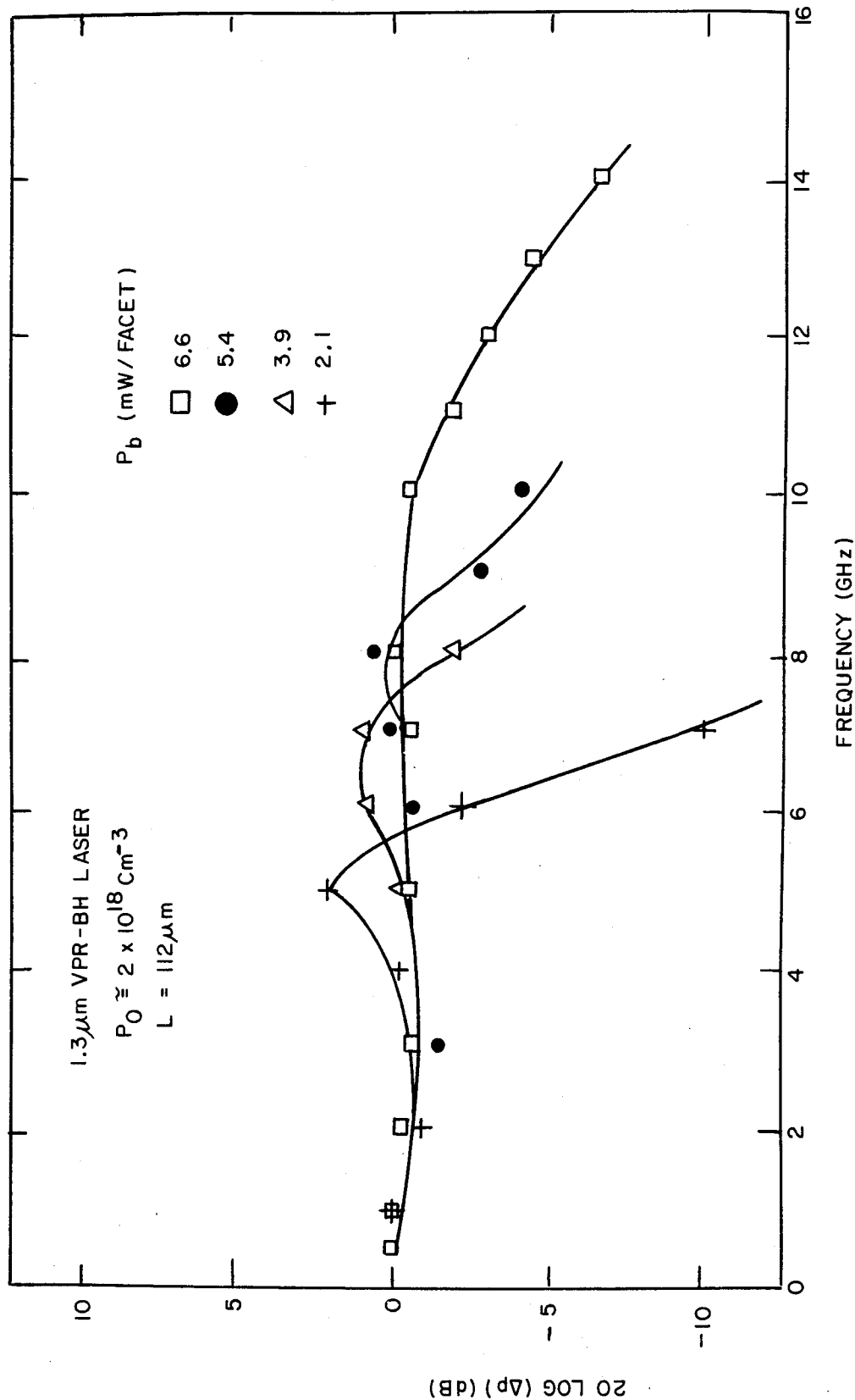
FIGS. 1A and 1B illustrate the flat optical response to $\geq$12 GHz obtained for the VPR-BH lasers of the present invention, grown on a conductive substrate.
Figure 1B:
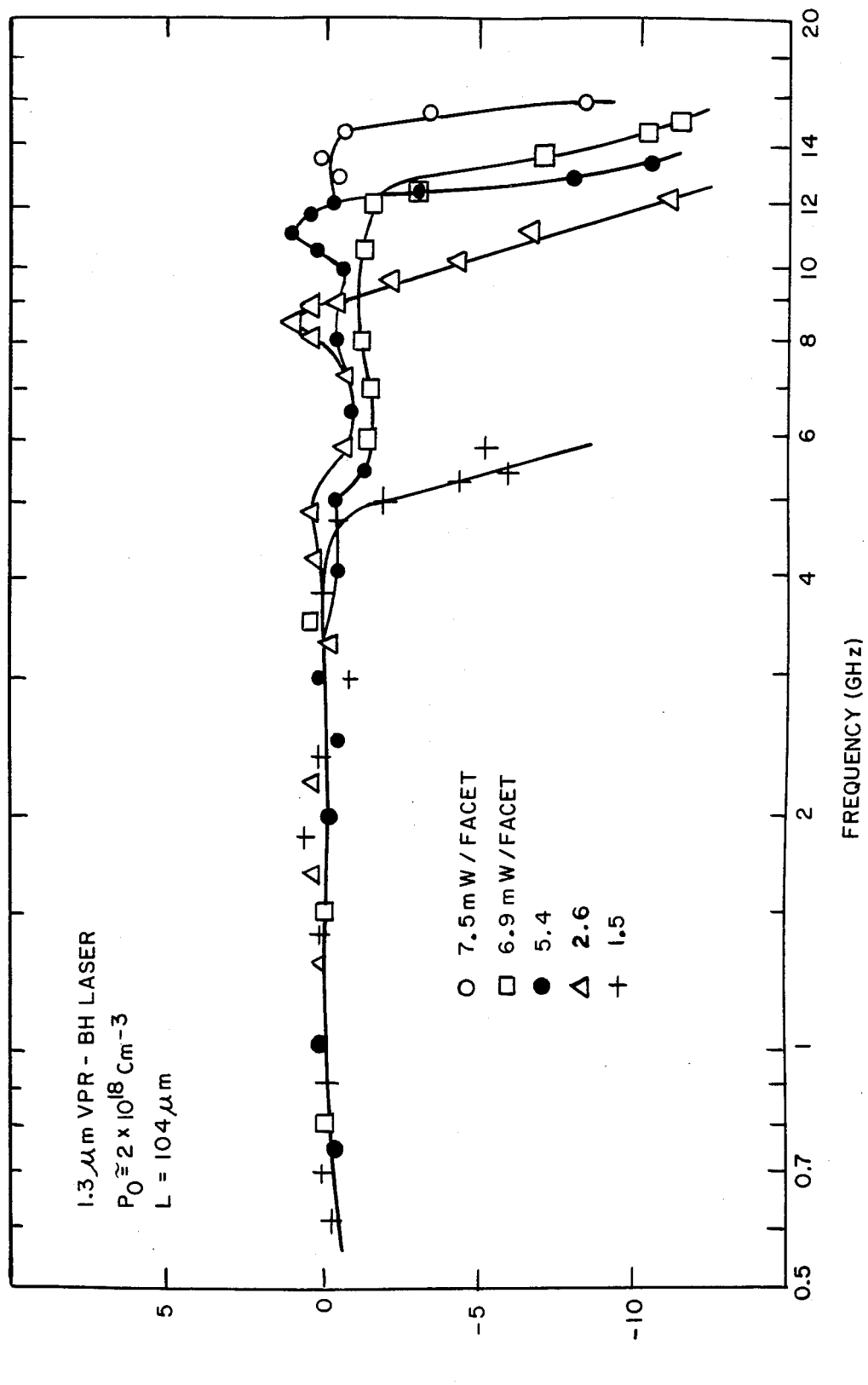

Referring to the Figures, the flat optical response to 12 GHz obtained for the VPR-BH lasers grown on conductive substrates (see, FIGS. 1A and 1B) is surprising since it has not been previously observed for other types of InGaAsP laser except for AlGaAs grown on semi-insulating substrates. The premature roll-off usually observed in buried heterostructure (BH) lasers is associated with the rf current shunt away from the active region by the effective parallel shunt capacitance $C_p$ associated with the laser.

Figure 2:
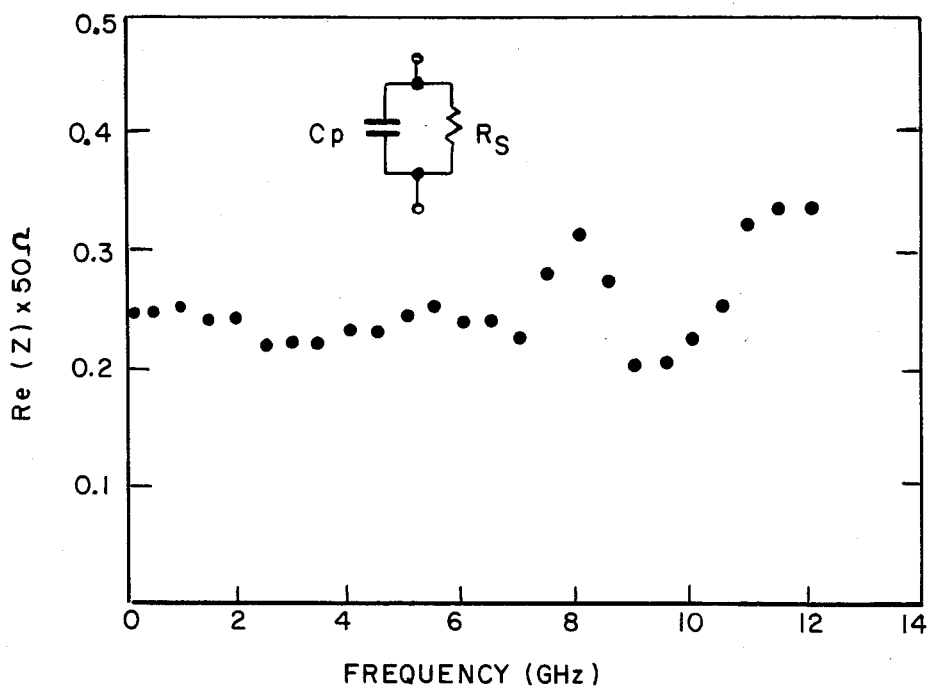
FIG. 2 is a plot of device impedance Re(Z) as a function of frequency.

Impedance measurements were used to determine the extent of the electrical shunt effect. The results of these measurements are shown in FIG. 2 where the real part of the device impedance Re(Z) is plotted as a function of frequency. Assuming that the electrical circuit of the diode is as shown in FIG. 2 (inset), where $R_s$ is the resistance in series with the diodes active region and $C_p$ is the parasitic shunt capacitance, the real part of the impedance Re(Z) looking into the diode is then given by $R_s/[1+(wR_sC_p)^2]$, and the ratio of the power driving the active region versus the total input power is given by $1/[1+wR_sC_p)^2]$. The effect of $C_p$ is to cause a roll-off in Re(Z) and in the power driving the active region. As shown in FIG. 2, the roll-off is not observed. The absence of a roll-off in Re(Z) is consistent with the flat optical response observed in the optical modulation experiments. Since $R_s$ is about 12 ohm, $C_p$ is estimated to be $\leq$1 pF for the VPR-BH lasers.

Figure 3:
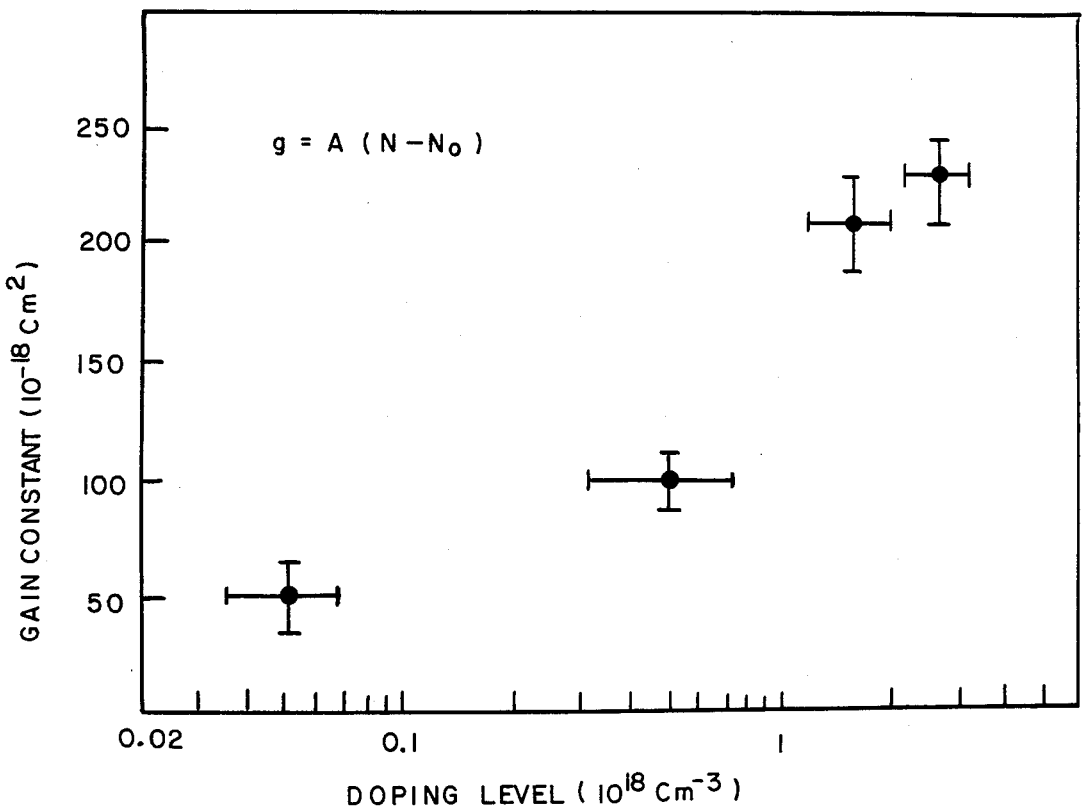
FIG. 3 is a plot of gain constant (A) versus the p-doping level.

The present invention is based on the following experiments: if the model gain is written as $A(N-N_o)$, then the threshold carrier density $\Gamma N_{th}$ is given by the threshold condition:

$$\Gamma A(N_{th}-N_o) = \alpha_T \quad (1)$$

where $\Gamma$ is the confinement factor, A the gain constant and $\alpha_T$, the total optical loss. To determine the gain constant A, the incremental change in the threshold carrier density $N_{th}$ due to a change in the mirror optical loss $\alpha_m$ was measured by immersion of diodes with different active layer doping level in various index fluids. According to equation (1) the gain constant A is given by, $$A = \Delta\alpha_m/(\Gamma\Delta N_{th}) \quad (2)$$

where $\Delta\alpha_m$ was calculated by the known refractive index of the immersion fluids and $N_{th}$ is measured by the $N_{th}$ measurement technique developed at GTE Laboratories. See, C. B. Su and R. Olshansky, *Appl. Phys. Lett.*, 43: 856 (1983). The measured gain constant A was found to be a strongly increasing function of the p-doping level. These results are shown in FIG. 3.

A practical application of the increase gain constant at higher doping levels is in the optimization of diode laser modulation bandwidth. Theoretical calculations indicate that the bandwidth, BW, is given by:

$$BW = \sqrt{(A)(P_b/L)} \quad (3)$$

where, $P_b$ is the bias optical power, L the cavity length and A the gain constant. According to equation (3), the experimental results predict that for devices with a highly p-doped active region, the modulation bandwidth is wider than for devices with a lightly p-doped active region.

Figure 4:
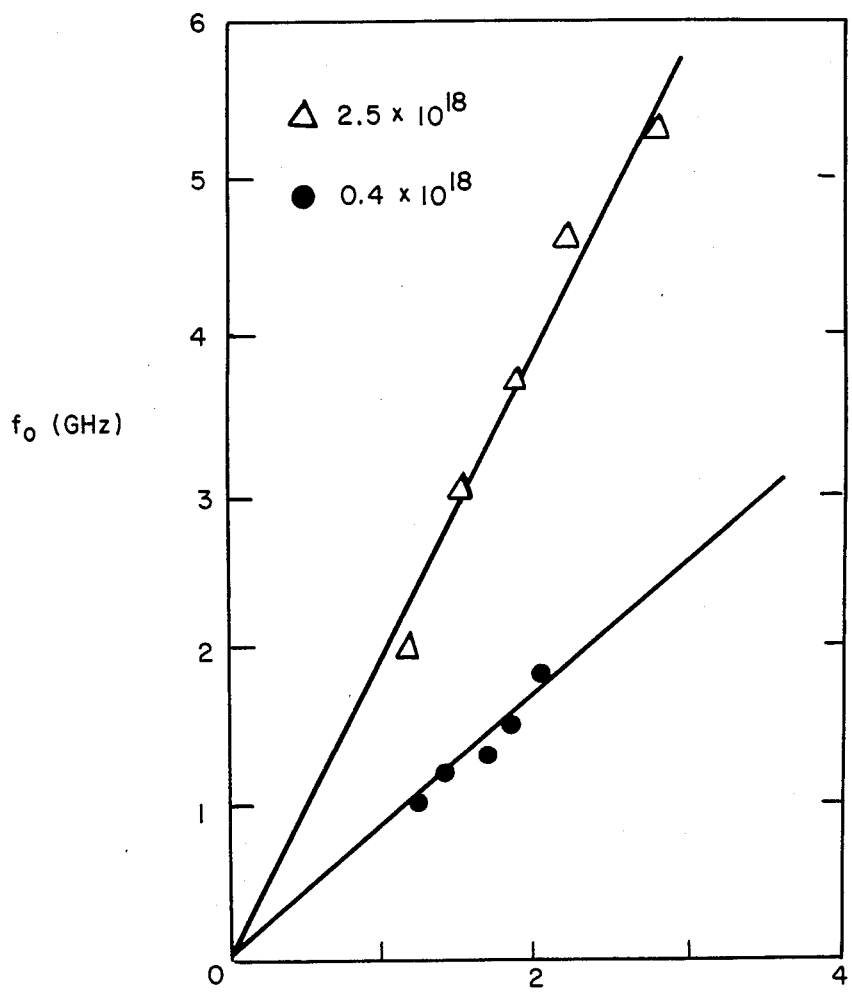
FIG. 4 is a comparison of the measured bandwidth versus the square root of the bias optical power for devices with different doping levels.

Direct current modulation experiments were performed on InGaAsp lasers with different active layer p-doping levels and Zinc was the preferred dopant. It was found that laser diodes prepared from wafers with highly p-doped active regions, showed appreciably larger bandwidths in comparison to diodes from lightly doped wafers. FIG. 4 illustrates this difference by plotting the measured bandwidth versus $\sqrt{P_b}$. A factor of two increase in bandwidth is achieved by increasing the doping level from $0.4\times10^{18}$ cm$^{-3}$ to $2.5\times10^{18}$ cm$^{-3}$. Several devices with different doping levels have been fabricated and tested. Larger gain constants and wider modulation bandwidths are seen in the highly doped devices.

The lasers of the present invention may be constructed using any of the methods available to the skilled artisan. Such methods include chemical vapor deposition (CVD), vapor phase epitaxy (VPE), liquid phase epitaxy (LPE) and molecular beam epitaxy (MBE). Preferably, VPE is used for at least part of the fabrication process.

The devices used in the present invention are similar in structure to BH lasers in which the lateral confining InP regions are obtained by the mass transport phenomena. See, for example, Lau et al., *Appl. Phys. Lett.*, 40: 568 (1982). For VPR-BH lasers the lateral confining InP regions are obtained by vapor phase regrowth rather than mass transport.

In the lasers of the present invention, the p-doping level in the active region is at least about $2\times10^{18}$ cm$^{-3}$. The active layer widths may range from about 4 to 5 $\mu$m with a thickness of about 0.2 $\mu$m. The room temperature threshold current is typically about 30 mA and the differential quantum efficiency is about 40%.

The following example is provided to aid in the understanding of the invention but is not to be construed as a limitation thereof.

EXAMPLE

A diode of the present invention was mounted on a microstrip line having an insertion loss of less than 2 dB to 14 GHz. The diode cavity length was 104 $\mu$m. The chip width was 250 $\mu$m and the top and bottom metallic surfaces were unetched. The pn homojunction was grown by trichloride VPE rather than by a standard LPE process. The p-doping level in the active region was $2\times10^{18}$ cm$^{-3}$. A GTE InGaAs PIN diode with a bandwidth $\geq 12$ GHz was used for optical detection. The detector bandwidth was estimated by the optical response when the present laser was driven by a short current pulse derived from a comb generator.

The FWHM of the optical pulse was 45 ps. The detector bandwidth was estimated at $\geq 12$ GHz when the 25 ps rise time of the S-4 sampling head was accounted for. An HP8350 sweep oscillator was used for sinusoidal current modulation and the optical signal was displayed on a sampling scope with a S-4 head.

A DCP-BH laser utilizes a reverse bias pnpn structure to achieve shunt current blocking, while the present structure utilizes a pn homojunction to achieve the same result.

In Table 1, the measured differential gain is summarized. The quantities $AN_{th}$ which are the sum of the $AN_o$ term and the total optical loss $\tau$ (eq. 1) are shown for several devices of the present invention. It is noted that $AN_{th}$ are roughly constant with a mean value of about 110 cm$^{-1}$ for devices with a wide range of doping levels. Since the cavity length of these diodes are 200 $\mu$m$\pm$5% a constant $AN_{th}$ implies that the sum of $AN_o$ and $\tau$ are approximately constant and the smaller $N_{th}$ for the highly doped devices are due to a larger differential gain constant.

TABLE I

| Measured threshold carrier density $N_{th}$ and the gain constant A for devices from wafers with different doping level $P_o$. | | | | | |
|---|---|---|---|---|---|
| Laser | $P_o$ ($10^{18}$ cm$^{-3}$) | $N_{th}$ ($10^{18}$ cm$^{-3}$) | $\Gamma$ | A ($10^{-18}$ cm$^2$) | $\Gamma AN_{th}$ (cm$^{-1}$) |
| 274-1 | 0.05 | 4.0 | 0.48 | 51 | 98 |
| 274-4 | 0.05 | 3.7 | 0.48 | 63 | 112 |
| 277-5 | 0.5 | 3.2 | 0.41 | 90 | 118 |
| 277-3 | 0.5 | 3.0 | 0.41 | 108 | 132 |
| 192-5 | 1.5 | 1.8 | 0.27 | 219 | 106 |
| 192-3 | 1.5 | 1.8 | 0.27 | 230 | 112 |
| 159-7 | 2.5 | 1.6 | 0.3 | 233 | 112 |

A practical application of the present invention is in the optimization of laser diode modulation bandwith.

The present invention has been described in detail, including the preferred embodiments thereof. However, it will be appreciated that those skilled in the art, upon consideration of the present disclosure, may make modifications and improvements on this invention and still be within the scope and spirit of this invention as set forth in the following claims.

What is claimed is:

1. In a high speed InGaAsP semiconductor laser comprising:
   (a) an n-type InP substrate;
   (b) an n-type InP confinement layer;
   (c) a p-type active layer of the formula:

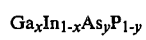

$Ga_xIn_{1-x}As_yP_{1-y}$ wherein;
$0 < x \leq 0.27$ and $0 < y \leq 0.59$;
(d) a p-type InP confinement layer; and
(e) a p-type InGaAsP cap layer;
the improvement comprising:
doping said active layer with a p-type dopant, at an impurity concentration of at least about $2.5 \times 10^{18}$ cm$^{-3}$ such that the modulation bandwith of said laser is increased according to the equation:

$$BW = \sqrt{(A)(P_b/L)}$$

wherein, $P_b$ is the bias optical power, L the laser cavity length, and A the gain constant.

2. The InGaAsP semiconductor laser of claim 1, wherein the active layer has the nominal formula:

$$Ga_{0.27}In_{0.73}As_{0.59}P_{0.41}$$

3. The InGaAsP semiconductor laser of claim 1, wherein said p-type dopant concentration is $2.5 \times 10^{18}$ cm$^{-3}$.

4. The InGaAsP semiconductor laser of claim 1, wherein said laser is a VPR-BH type structure.

5. The InGaAsP semiconductor laser of claim 1, wherein the p-type dopant is Zinc.

6. The InGaAsP semiconductor laser of claim 2, wherein the p-type dopant is Zinc.

7. The InGaAsP semiconductor laser of claim 3, wherein the p-type dopant is Zinc.

8. The InGaAsP semiconductor laser of claim 4, wherein the p-type dopant is Zinc.

9. A method of increasing laser modulation bandwidth in a high speed InGaAsP semiconductor laser comprising;
doping the active layer of said laser with a p-type dopant at an impurity concentration level greater than or equal to about $2.5 \times 10^{18}$ cm$^{-3}$.

10. The method of claim 9, wherein the InGaAsP laser active layer has the formula:

$$Ga_{0.27}In_{0.73}As_{0.59}P_{0.41}.$$

11. The method of claim 9, wherein said laser is a VPR-BH type sructure.

12. The method of claim 9, wherein the p-type dopant is Zinc.

13. The method of claim 10, wherein the p-type dopant is Zinc.

14. The method of claim 11, wherein the p-type dopant is Zinc.

* * * * *